US008095354B2

(12) United States Patent
Tamaki et al.

(10) Patent No.: US 8,095,354 B2
(45) Date of Patent: Jan. 10, 2012

(54) POWER CONSUMPTION PEAK ESTIMATION PROGRAM FOR LSI AND DEVICE THEREFOR

(75) Inventors: Kazuhide Tamaki, Kawasaki (JP); Ryuji Fujita, Kawasaki (JP); Junichi Niitsuma, Kawasaki (JP); Takayuki Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 895 days.

(21) Appl. No.: 11/896,943

(22) Filed: Sep. 6, 2007

(65) Prior Publication Data

US 2008/0077380 A1    Mar. 27, 2008

(30) Foreign Application Priority Data

Sep. 6, 2006   (JP) .................. 2006-240970

(51) Int. Cl.
*G06F 17/50* (2006.01)
*G06F 9/45* (2006.01)
*G06F 9/455* (2006.01)
*G06G 7/62* (2006.01)

(52) U.S. Cl. .................. 703/18; 703/2; 703/13; 703/14; 703/15; 716/4; 716/103; 716/106; 716/108; 716/109

(58) Field of Classification Search .................. 703/18, 703/2, 13, 14, 15; 716/4, 103, 106, 108, 716/109
See application file for complete search history.

(56) References Cited

U.S. PATENT DOCUMENTS

| | | | | |
|---|---|---|---|---|
| 5,668,732 A | * | 9/1997 | Khouja et al. ................. 702/60 |
| 5,696,694 A | * | 12/1997 | Khouja et al. ................. 716/120 |
| 5,815,416 A | * | 9/1998 | Liebmann et al. ............. 703/18 |
| 5,835,380 A | * | 11/1998 | Roethig ........................ 716/108 |
| 5,857,164 A | * | 1/1999 | Wakita ............................ 702/64 |
| 5,903,476 A | * | 5/1999 | Mauskar et al. .............. 716/109 |
| 6,075,932 A | * | 6/2000 | Khouja et al. ................ 716/109 |

(Continued)

FOREIGN PATENT DOCUMENTS

JP    2-136755    5/1990

(Continued)

OTHER PUBLICATIONS

Devdas et al."Estimation of Power Dissipation in CMOS Combinational Circuits Using Boolean Function Manipulation", IEEE Transactions on Computer-Aided Design, vol. 11, No. 3, Mar. 1992.*

(Continued)

*Primary Examiner* — Kamini S Shah
*Assistant Examiner* — Shambhavi Patel
(74) *Attorney, Agent, or Firm* — Fujitsu Patent Center

(57) ABSTRACT

As a program tool of the embodiment estimating the peak of power consumption, primary processing is performed in which logic simulation is executed in a first time period to extract operation data of a gated clock for every predetermined section within the first time period, e.g. operation waveform data or data on the number of operations. Then, a narrowed section, which is composed of one or more sections and in which the switching activity per unit time is higher compared to other sections, is discovered, the switching activity being obtained from the operation data, and this narrowed section is taken as a second time period. Then, secondary processing is performed in which logic simulation is executed in the second time period to extract signal waveform data for every clock cycle and obtain power consumption data corresponding to the clock cycles from the extracted signal waveform data.

21 Claims, 13 Drawing Sheets

U.S. PATENT DOCUMENTS

| | | | |
|---|---|---|---|
| 6,330,703 B1 * | 12/2001 | Saito et al. | 716/136 |
| 6,345,379 B1 * | 2/2002 | Khouja et al. | 716/115 |
| 6,625,784 B1 | 9/2003 | Ohta et al. | |
| 6,748,572 B2 * | 6/2004 | Fujine | 716/111 |
| 7,278,120 B2 * | 10/2007 | Rahmat et al. | 716/111 |
| 7,539,958 B2 * | 5/2009 | Wilcox et al. | 716/136 |
| 2006/0149527 A1 * | 7/2006 | Toms | 703/18 |
| 2006/0277509 A1 * | 12/2006 | Tung et al. | 716/5 |
| 2006/0282803 A1 * | 12/2006 | Wilcox et al. | 716/4 |

FOREIGN PATENT DOCUMENTS

| | | |
|---|---|---|
| JP | 2-171861 | 7/1990 |
| JP | 2001-59856 | 3/2001 |
| JP | 2002-92065 | 3/2002 |
| JP | 2002-288257 | 10/2002 |
| JP | 2003-256495 | 9/2003 |
| JP | 2004-62238 | 2/2004 |

OTHER PUBLICATIONS

Chen, et al. "LPGC: A Novel Low Power Driven Placement Algorithm Based on Optimal Gated Clock Topology", Jun. 2005.*

Liu et al. "Power Consumption Estimation in CMOS VLSI Chips", IEEE Journal of Solid-State Circuits, vol. 29, No. 6, Jun. 1994.*

Degalahal et al. "Methodology for High Level Estimation of FPGA Power Consumption", IEEE 2005.*

Chaudhry et al. "A Cycle Accurate Power Estimation Tool", 2006.*

Donno et al. "Clock-Tree Power Optimization based on RTL Clock-Gating", ACM 2003.*

* cited by examiner

POWER CONSUMPTION PEAK ESTIMATION DEVICE

ORIGINAL CIRCUIT SIZE INFORMATION — 34

Number of cells
m_top 80
U1 120
U2 120
U3 533

WEIGHTING COEFFICIENT CONVERSION ⇒

COEFFICIENT OF EACH MODULE
m_top 1.0
U1 1.5
U2 1.5
U3 6.7

36(2)

```
clock = 100e+06[Hz] ;{
  label = MCLK1 ;

clk = 2 ;
  /** additional clock source(s) **/
  U1.m_GCLK1.    GOUT = 0;
  mas_GCLK1.     GOUT = 0 ;
  U2.m_GCLK1.    GCOUT = 0;
  mas_GCLK2.     GOUT = 0;
  U3.m_GCLK1.    GOUT = 0;
  mas_GCLK3.     GOUT = 0;
}
```

} PASS

FIG.12

```
// gclk primitive module GCLK_CELL (EN, CK, GOUT);
input   EN ;
input   CK ;
output  GOUT ;

reg M;
wire overflow;
reg xrst;

always @(EN or CK ) begin          ⎫
    if (CK == 1'b0) begin          ⎪
        M <= G;                    ⎬ 70
    end                            ⎪
end                                ⎭ assign GOUT = ( CK==1'b0 )? 1'b0 : M ;  } 72 gated_count   PCNT_MOD_GCLK(       ⎫
        .xrst(xrst),               ⎪
        .GCLK(GOUT),               ⎬ 74
        .count_val0,               ⎪
        .overflow(overflow)        ⎪
                );                 ⎭
endmodule
```

```
module gated_count(xrst, GCLK, count_val, overflow);

input xrst;
input GCLK;
output [p_count_val_msb:0] count_val;
output overflow;
reg [p_counter_msb:0] counter1;
reg      overflow;
wire [p_count_val_msb:0] count_val;

always @(posedge GCLK or negedge xrst) begin
    if (~xrst) begin
        counter1 <= 0;
        overflow <= 0;
    end
    else if(overflow == 1'b1) begin
        overflow <= overflow;
    end
    else begin
        counter1 <= counter1 + 1;
        overflow <= &counter1;
    end
end assign count_val = counter1;
endmodule
```

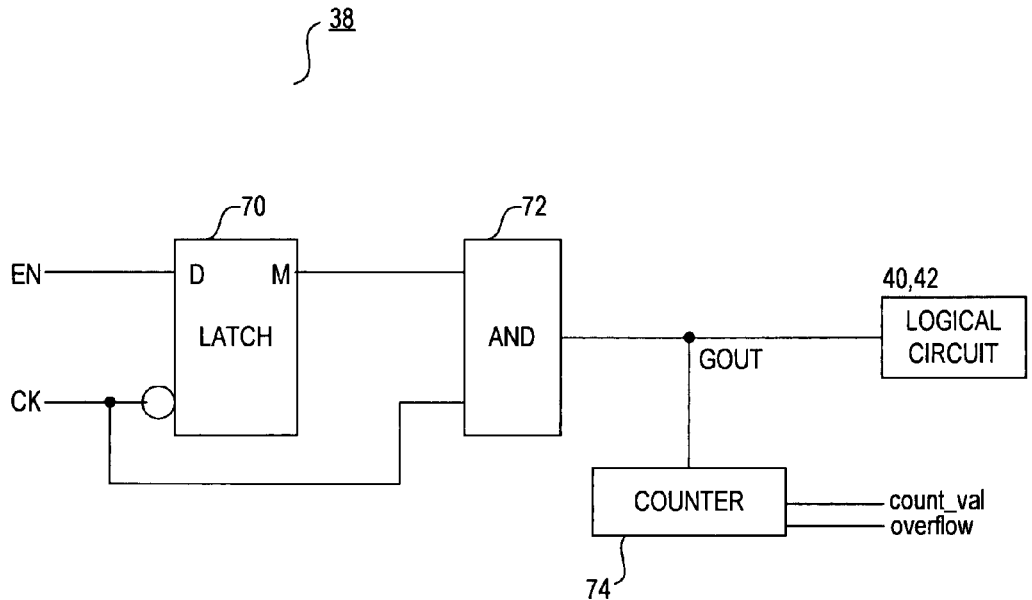

FIG.13

37. READ COMMAND FILE

```
master_counter = [signal -get master_counter¥[5:0¥]] >> out_file
U1.m_GCLK1.X = [signal -get m_top.U1.m_GCLK1.PCNT_MOD_GCLK.count_val¥[5:0¥]] >> out_file
mas_GCLK1.X = [signal -get m_top.mas_GCLK1.PCNT_MOD_GCLK.count_val¥[5:0¥]] >> out_file
U2.m_GCLK1.X = [signal -get m_top.U2.m_GCLK1.PCNT_MOD_GCLK.count_val¥[5:0¥]] >> out_file
mas_GCLK2.X = [signal -get m_top.mas_GCLK2.PCNT_MOD_GCLK.count_val¥[5:0¥]] >> out_file
U3.m_GCLK1.X = [signal -get m_top.U3.m_GCLK1.PCNT_MOD_GCLK.count_val¥[5:0¥]] >> out_file
mas_GCLK3.X = [signal -get m_top.mas_GCLK3.PCNT_MOD_GCLK.count_val¥[5:0¥]] >> out_file
******** >> out_file
```

POWER CONSUMPTION PEAK ESTIMATION PROGRAM FOR LSI AND DEVICE THEREFOR

CROSS-REFERENCE TO RELATED APPLICATIONS

This application is based upon and claims the benefit of priority from the prior Japanese Patent Application No. 2006-240970, filed on Sep. 6, 2006, the entire contents of which are incorporated herein by reference.

BACKGROUND EMBODIMENT

1. Field Embodiment

The embodiment relates to a program for estimating the peak of power consumption of an LSI, and a device for such a program. The embodiment particularly relates to a power consumption peak estimation program capable of estimating the peak of power consumption with a small number of man-hours, and a device for such a program.

2. Description of the Related Art

The design of a semiconductor integrated circuit (LSI) has the steps of logically synthesizing a RTL file written in a hardware description language (HDL) to create a netlist, and designing a layout based on this netlist to create layout data. In the stage of creating a netlist, logic verification and estimation of power consumption are performed.

As a tool for analyzing power consumption of an LSI, there is known the PrimePower (product name) manufactured by Synopsys, Inc. This power consumption analysis tool takes signal waveform data of a circuit cell as input data, the signal waveform data being obtained by performing a logic simulation on a netlist, and calculates power consumption in a predetermined time period from the signal waveform data and power consumption data of a cell within a cell library. By calculating power consumption from the signal waveform data for every clock cycle, a peak value of the power consumption in the predetermined time period can be estimated.

Japanese Patent Application Laid-Open No. 2004-62238, Japanese Patent Application Laid-Open No. 2002-288257, Japanese Patent Application Laid-Open No. 2001-59856, Japanese Patent Application Laid-Open No. 2003-256495, and Japanese Patent Application Laid-Open No. H2-136755 describe a method of estimating power consumption of an LSI.

According to Japanese Patent Application Laid-Open No. 2004-62238, a measurement circuit for measuring a signal variable of a gate is added to a target logic circuit in which power consumption in a integrated circuit is to be calculated, to configure a device, and signal variables measured after a certain operation are accumulated, whereby power consumption in a logic circuit is calculated.

According to Japanese Patent Application Laid-Open No. 2002-288257, a toggle detection circuit aspects a toggle of a logic gate output of a target circuit for power consumption measurement and adds up the number of toggles, and the number of toggles of the toggle detection circuit is extracted at the end of simulation to calculate power consumption.

Japanese Patent Application Laid-Open No. 2001-59856 describes a structure, test method and design method for restraining peak power consumption at the time of testing an integrated circuit device.

According to Japanese Patent Application Laid-Open No. 2003-256495, logic circuit simulation is executed using a RT netlist and test pattern of the entire LSI to collect the number of memory accesses, while simulation is executed using a netlist of a memory section to collect memory consumption current, and memory average power consumption is calculated from the number of memory accesses and the memory consumption current.

According to Japanese Patent Application Laid-Open No. H2-136755, logic simulation is executed on a digital circuit to obtain digital operation historical information of each element, and the total consumption current of a target circuit for consumption current estimation is estimated based on the digital operation historical information and a general formula for consumption current estimation for each element. Japanese Patent Application Laid-Open No. H2-171861 describes the same thing as Japanese Patent Application Laid-Open No. H2-136755, regarding the method of calculating the power consumption of a CMOS gate array.

On the other hand, Japanese Patent Application Laid-Open No. 2002-92065 describes a circuit design method for selectively changing a flip-flop to a flip-flop having a gated flip-flop buffer, in order to cut power consumption of an LSI.

Recently LSI's have been miniaturized and subjected to power/voltage reduction, thus the voltage drop caused by extreme power consumption has been a problem. Therefore, it is required to estimate, in a stage of developing an LSI, the detail of the processing of the LSI in which the peak of power consumption is generated, the time at which the processing occurs, as well as peak values.

In a conventional power analysis method, logic simulation is executed to obtain signal waveform data of a cell, and then power consumption for every cycle is obtained based on the signal waveform data and the power consumption data of a cell library, as described above. A power consumption peak can be obtained from the obtained power consumption in each cycle.

However, it is difficult to predict the operation in which the power consumption of an LSI reaches a peak value. Therefore, logical simulation cannot performed in a limited manner only on a time period having the peak value. For this reason, it is necessary to execute logic simulation on all operations that the LSI might perform, requiring long hours of logic simulation. Such logic simulation means to realize the same operation as a state in which the system is actually applied, and usually has tens of million through hundreds of millions of cycles.

In the long hours of logic simulation, it takes several weeks to several months to extract the signal waveform data of a long cycle in a simulation using a software simulator, which is not realistic. Further, even when performing simulation using hardware such as an emulator, large amounts of signal waveform data have to be transferred to a host computer, requiring a long period of time.

In conventional power consumption peak estimation programs for an LSI take a large number of man-hours to estimate the power consumption.

SUMMARY

The embodiment provided that a power consumption peak estimation program estimating a power consumption peak, the program causing a computer to construct a primary processing unit, which executes logical simulation on the netlist throughout a first time period to extract operation data of a gated clock for every predetermined section within the first time period, a secondary processing unit, which executes logical simulation on the netlist throughout a narrowed section to extract signal waveform data for every clock cycles in the narrowed section, the narrowed section being composed of one or a plurality of sections in which the switching activity of the gated clock, which is obtained from the operation data extracted by the primary processing unit, is higher than the switching activity in other sections, and a power consumption generating unit, which generates power consumption data corresponding to the clock cycles, from the signal waveform data extracted by the secondary processing unit.

BRIEF DESCRIPTION OF THE DRAWINGS

FIG. 12 is a figure showing a gated clock buffer with counter included in an emulation netlist;

FIG. 13 is a figure showing an example of a lead command file; and

DESCRIPTION OF THE PREFERRED EMBODIMENTS

Figure 1:
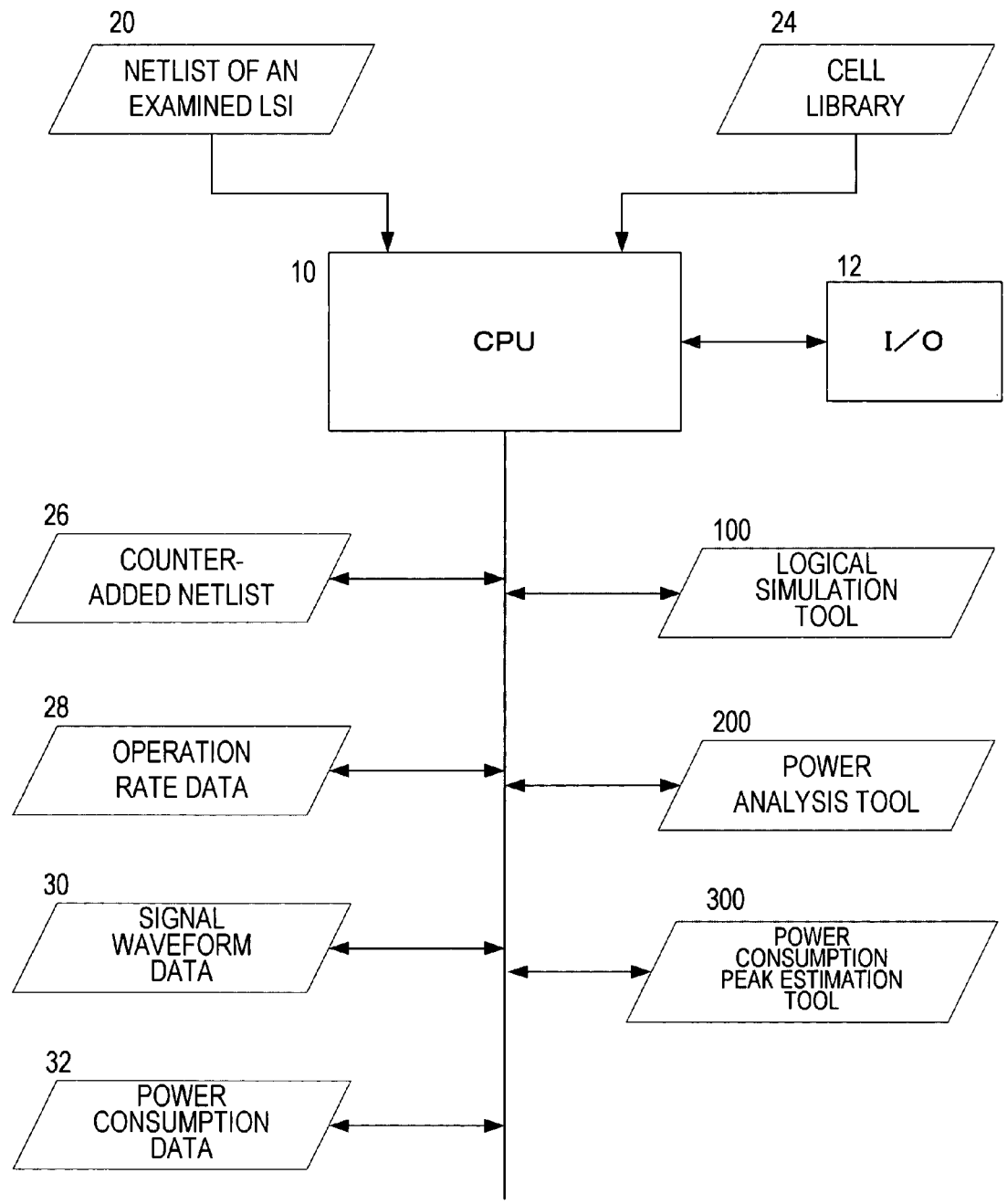
FIG. 1 is a configuration diagram of a power consumption peak estimation device according to an embodiment.

Hereinafter, embodiments are described with reference to the drawings. FIG. 1 is a configuration diagram of a power consumption peak estimation device according to the embodiment. In addition to a CPU 10 and input/output means 12 such as a keyboard and a display monitor, a logical simulation tool 100, power analysis tool 200 and power consumption peak estimation tool 300 are provided as a group of programs. When estimating a power consumption peak, the power consumption peak estimation tool 300 is executed by the CPU 10, and the logical simulation tool 100 and power analysis tool 200 are executed by the CPU 10 according to need.

The logical simulation tool 100 is executed with respect to a netlist to extract signal waveform data of a clock and data when an LSI of the netlist is operated for a predetermined pattern, e.g., data of H, L levels for, for example, each clock cycle. The power analysis tool 200 references the netlist and attribute data on power consumption of cell library to compute power consumption for every clock cycle from the abovementioned signal waveform data.

As the logical simulation tool 100, for example, NC-Verilog of Cadence, Inc. is known. Furthermore, PrimePower of Synopsys, Inc. is known as the power analysis tool 200.

The power consumption peak estimation tool 300 repeats primary processing for executing logical simulation with respect to a netlist and extracting operation data of a gated clock for every predetermine section, and narrows the section in which the switching activity obtained from the operation data is high. Specifically, the power consumption peak estimation tool 300 detects the section having high switching activity every time the primary processing is ended, and further performs the primary processing for this section to detect a short section having higher switching activity. The power consumption peak estimation tool 300 then execute logical simulation by means of the logical simulation tool 100 for the narrowed section to extract signal waveform data, and performs secondary processing for executing power analysis processing by means of the power analysis tool 200 and computing power consumption for every clock cycle from the signal waveform data.

Therefore, this power consumption peak estimation device is provided with a netlist 20 for an examined LSI and with a cell library 24 having power consumption attribute data. When estimating a power consumption peak, signal waveform data 30, switching activity data 28 and power consumption data 32 are generated.

Furthermore, in a preferred example of the embodiment, a counter-added netlist 26 is created in which a counter for counting the changes of a gated clock is added to the netlist 20 for an examined LSI. When the logical simulation tool 100 executes simulation on this counter-added netlist 26, the number of times that the gated clock changes is generated in the counter. This counter value is extracted as the operation data of the gated clock. Therefore, by extracting the counter value for every predetermined section, the number of operations of the gated clock for every predetermined section can be extracted. This number of operations is same as the switching activity.

As described hereinafter in detail, the gated clock is a clock that is generated by a clock gate which supplies a clock to a circuit on a subsequent stage in accordance with an enable signal. The clock is supplied to a circuit group on a subsequent stage when the enable signal is in an activated state, but the clock is not supplied to the circuit group on the subsequent stage when the enable signal is in a non-activated state. Therefore, by monitoring the switching activity of this gated clock, power consumption of the circuit group on the subsequent stage can be estimated to a certain extent. Specifically, the switching activity of the gated clock and the power consumption are correlated with each other.

Figure 2:
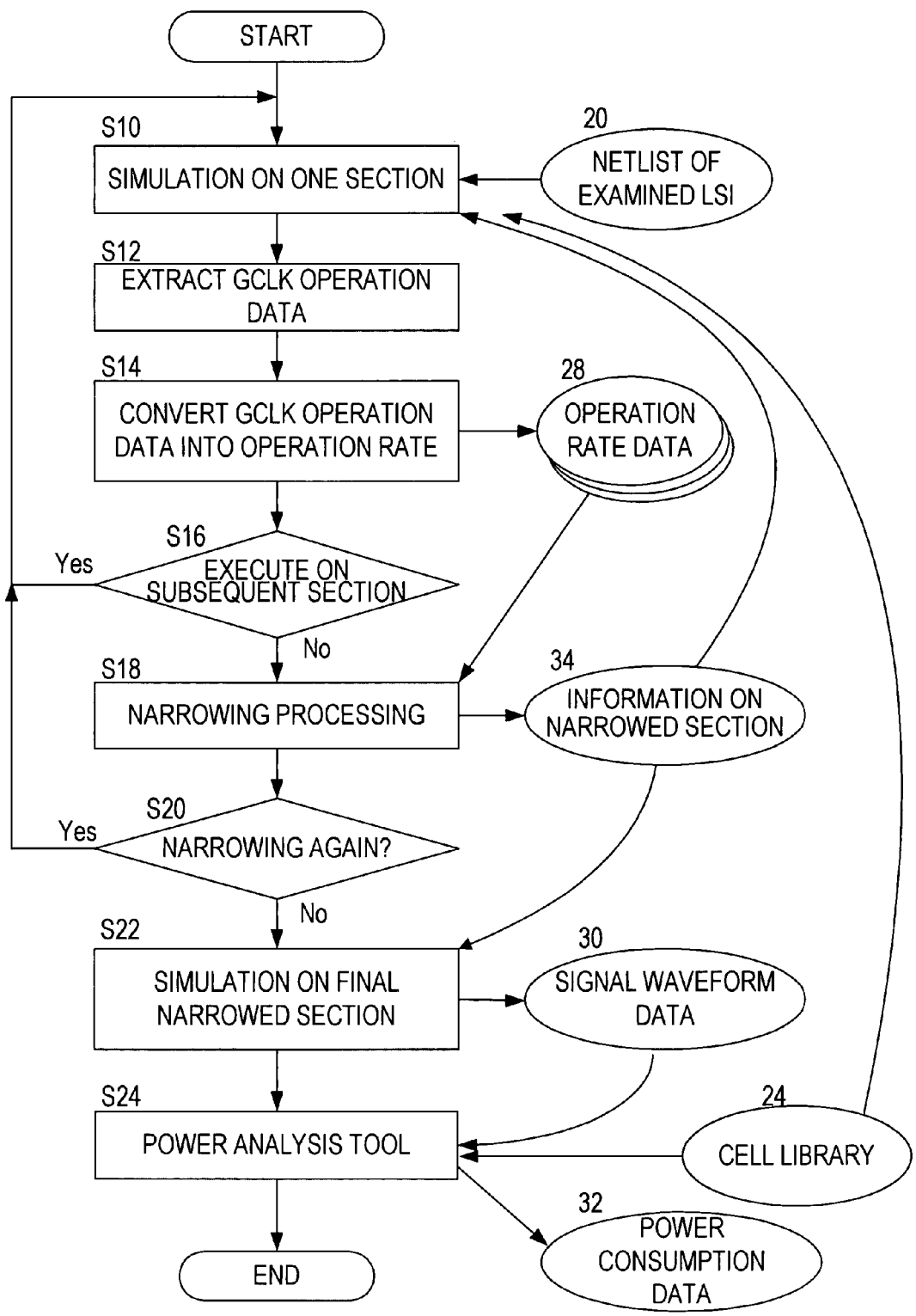
FIG. 2 is a flowchart showing a procedure of a power consumption peak estimation program according to the embodiment.

FIG. 2 is a flowchart showing a procedure of a power consumption peak estimation program according to the embodiment. Here, a schematic procedure of the estimation program is explained for both cases where the counter-added netlist for counting the number of changes of the gated clock is used and not used. Thereafter, a specific example of a method of using an emulation netlist by means of an emulator is described. It should be noted that in the processing in this flowchart the power consumption peak estimation tool 300 is executed as the main program, and the logical simulation tool 100 and power analysis tool 200 are executed as the subprograms.

Processes S10 through S20 correspond to the primary processing, and a process S22 corresponds to the secondary processing. First, a relatively long time period in which a power consumption peak certainly occurs is divided into a plurality of sections, and the logical simulation tool 100 executes simulation for the netlist 20 of the examined LSI for each section (S10). In this logical simulation step S10, information on a gated clock of great importance within the netlist is provided, and the logical simulation tool extracts operation data of this important gated clock (S12). This operation data is, for example, signal waveform data of the gated clock (a data string of H, L levels per clock cycle). As a result of executing the logical simulation for each section in this manner, the signal waveform data of the gated clock specified by gated clock data is extracted.

Then, the operation data of the gated clock within each section is converted into switching activity of the gated clock (S14). In the case where the operation data is the signal waveform data, the number of changes of this signal waveform data per unit time corresponds to the operation data. The processes S10 through S14 are repeated for a plurality of sections (S16). In the first primary processing, operation data of the gated clock is extracted for each of the plurality of sections within a long simulation target time period.

Figure 3:
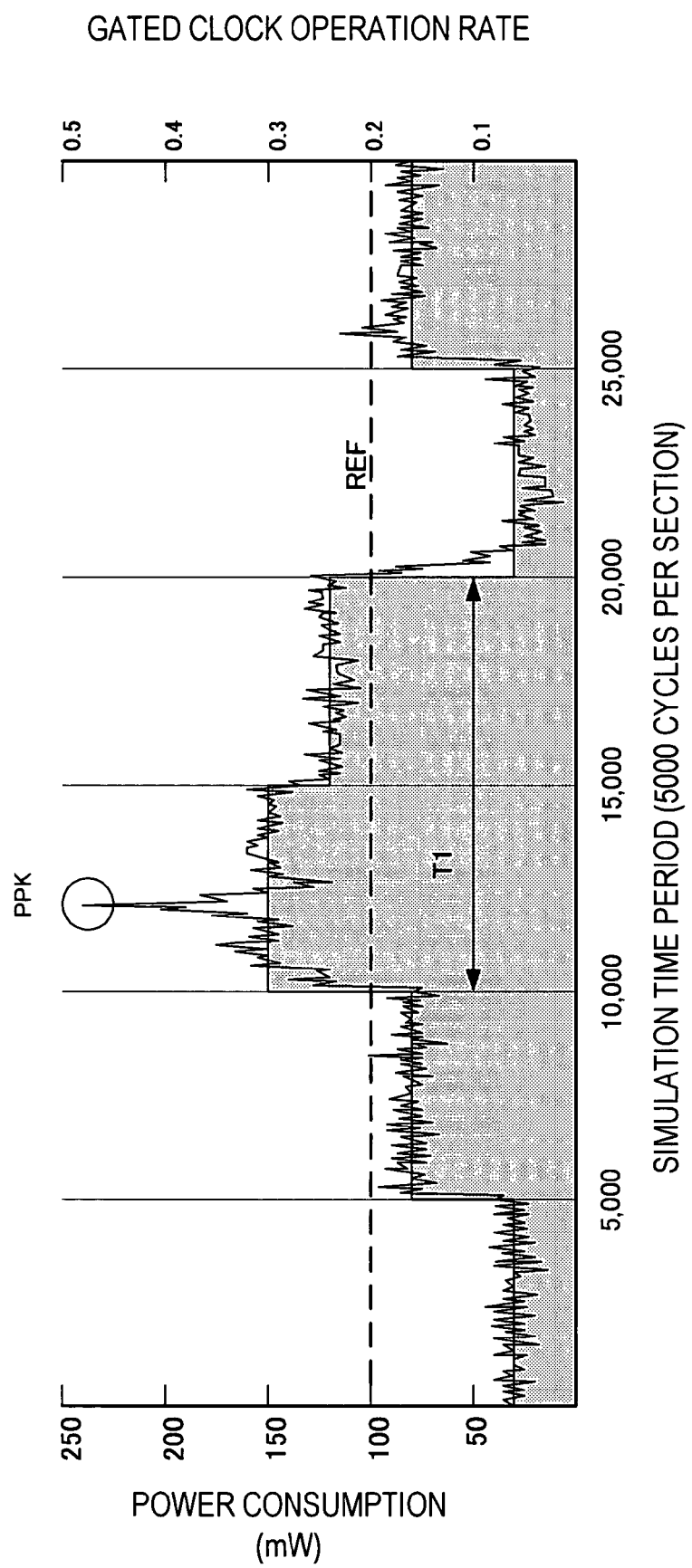
FIG. 3 is a figure showing an example of simulation time, gated clock switching activity, and actual power consumption at the point of time at which the first primary processing is ended.

FIG. 3 is a figure showing an example of simulation time, gated clock switching activity, and actual power consumption at the point of time at which the first primary processing is ended. The actual power consumption is shown in the line chart, and there is shown a power peak value PPK. This line chart of power consumption cannot be obtained in a simulation. Also, the bar chart shows the switching activity of the gated clock for each section. In the example shown in FIG. 3, the simulation time period is between 0 cycle and 30000 cycles, which is relatively long, and this time period is divided into sections of 5000 cycles. The switching activity of the gated clock of each section (5000 cycles) is superimposed on the line chart of the actual power consumption and displayed.

As shown in FIG. 3, the switching activity is high in a section where the power consumption is high, while the switching activity is low in a section where the power consumption is low. In this manner, there is a predetermined correlation between the power consumption and the switching activity of the gated clock, thus, by monitoring the switching activity of the gated clock, the section having the power consumption peak value PPK can be narrowed. In the example shown in FIG. 3, of the all clock cycles 0 through 30000, two sections T1 (10000 through 20000 cycles) having higher gated clock switching activity than other sections are narrowed (S18). In this narrowing processing, a plurality of upper sections out of the all sections in FIG. 3, e.g., two sections, are narrowed, or the all sections are narrowed into a certain percentage of the upper sections, e.g., 20% of the upper sections. Alternatively, in the narrowing processing, a certain percentage of the maximum switching activity, e.g., 70%, is computed as a reference switching activity REF, and the all sections are narrowed into a section having the switching activity higher than the reference switching activity REF.

Then, the narrowed sections T1 are divided into further small sections, and the primary processes S10 through S16 are repeated (YES in S20).

Figure 4:
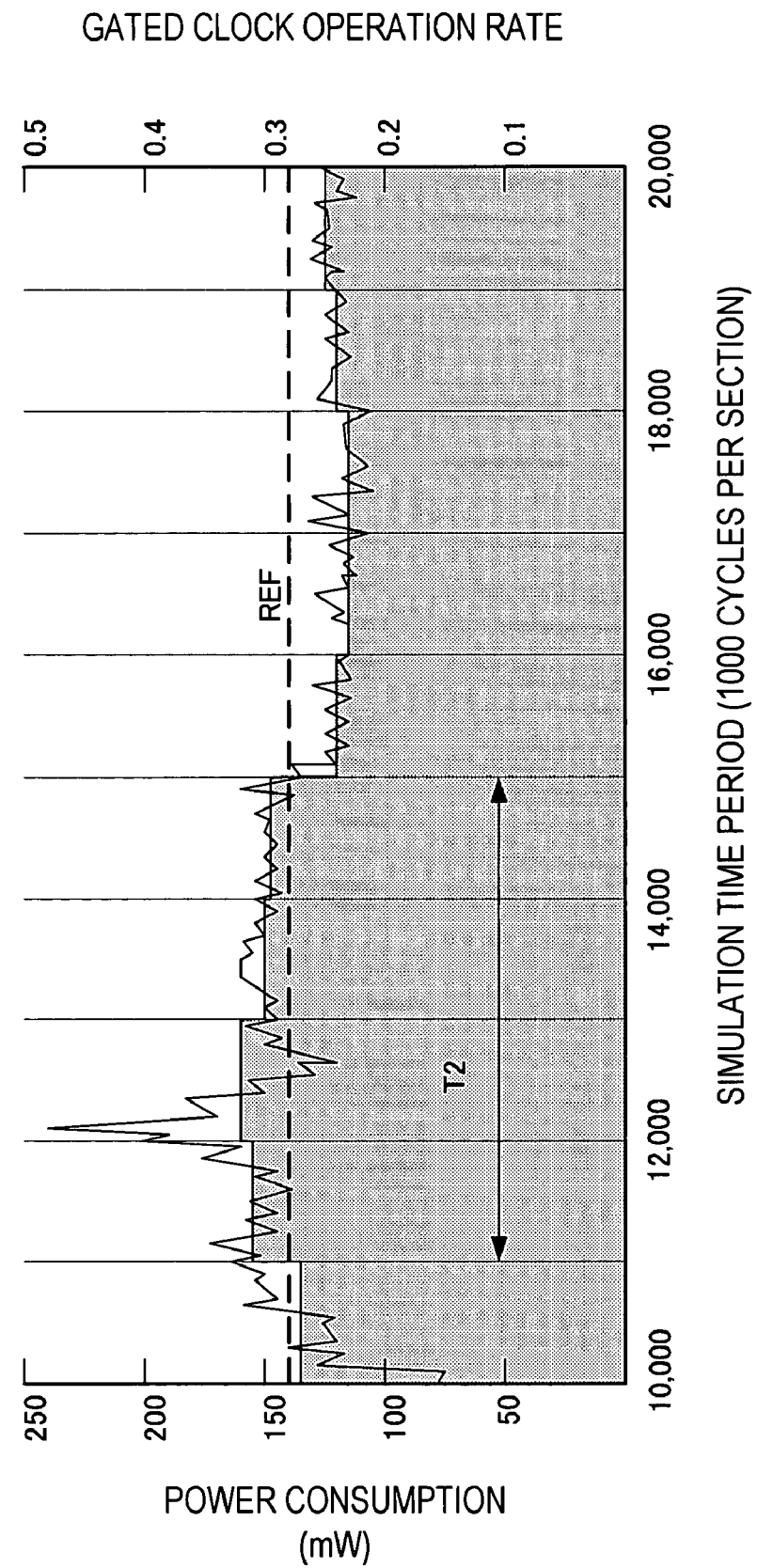
FIG. 4 is a figure showing an example of the simulation time, gated clock switching activity, and actual power consumption at the point of time at which the second primary processing is ended.

FIG. 4 is a figure showing an example of the simulation time, gated clock switching activity, and actual power consumption at the point of time at which the second primary processing is ended. In the second primary processing, the sections T1 between the clock cycles 10000 and 20000 are divided into 10 sections, which are shorter than the simulation time of the first primary processing, to extract the switching activity. Then, a section T2, which has the switching activity higher than the reference switching activity REF that is obtained by multiplying the maximum switching activity by the ratio, is narrowed (S18). In the example shown in FIG. 4, the narrowed section T2 is a section between 11000 and 15000.

The above primary processing and the narrowing processing are repeated until the primary processing is repeated a predetermined number of times or until the narrowed section T2 has a predetermined number of cycles or lower (S20). If one of the above conditions is satisfied, a plurality of primary processings are ended, and the step proceeds to the second any processing of a process S22. In the case where the sections can be narrowed into a small section at once in the primary processing, it is not necessary to repeat the primary processing.

Although the signal waveform data of the gated clock is extracted as operation data and converted into switching activity every time the logical simulation is executed per section, when all signal waveform data of the gated clock in all clock cycles can be saved, it is not necessary to repeat the logical simulation step S10. It is only necessary to divide the narrowed new small section T1 into a plurality of sections to obtain switching activity for each new section from the saved signal waveform data. In other words, it is only necessary to execute the processes S12, S14 for each new section.

In the above primary processing, the logical simulation is executed to extract the signal waveform data, but the target of the logical simulation is limited to the gated clock. Therefore, compared to extracting all signal waveform data items, the logical simulation can be completed in a short amount of time.

The second primary processing is carried out for the sections which are finally narrowed in the primary processing. Specifically, the logical simulation is executed by the logical simulation tool 100 for the final narrowed sections, and the signal waveform data 30 required for computing power consumption is extracted (S22). Specifically, signal waveform data of not only the gated clock but also of a data line are extracted. Although this logical simulation is for extracting a number of signal waveform data, the simulation time period is as short as the final narrowed section, thus this simulation can also be completed within a relatively short time. Here, it is assumed that the third primary processing is carried out so that the final narrowed sections consist of 12000 through 13000 cycles.

The power analysis tool 200 is executed to compute the power consumption data 32 for each clock cycle from the signal waveform data 30 (S24). At this moment, the power analysis tool 200 inputs the signal waveform data 30 and references the power consumption attribute data of a cell of the cell library 24 to compute a power consumption value for each clock cycle. The function of the power analysis tool is same as the one provided in a conventional tool. The power consumption attribute data of the cell is, for example, a value of power consumed by the operation in response to the change of clock.

Figure 5:
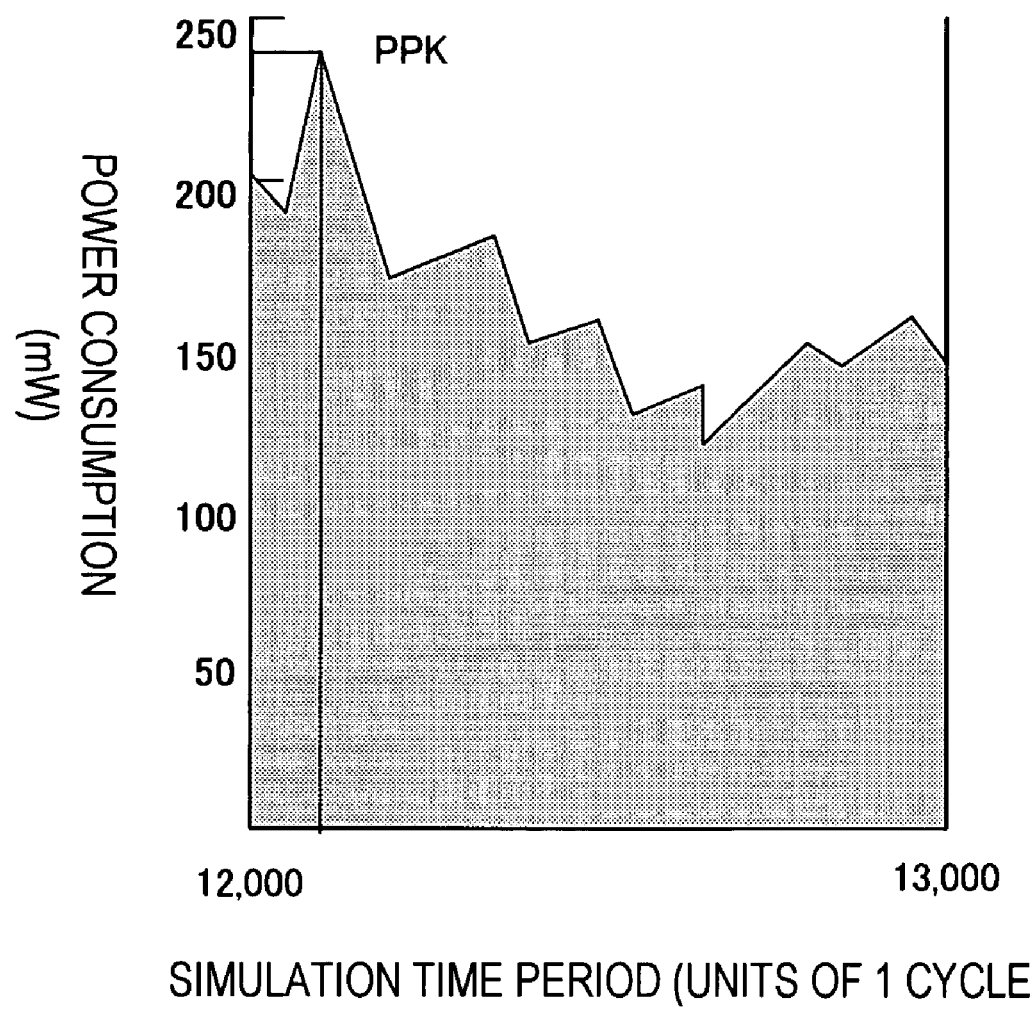
FIG. 5 is a figure showing an example of power consumption data 32.

FIG. 5 is a figure showing an example of the power consumption data 32. In the final narrowed section (12000 through 13000 clock cycles), transits of power consumption in each clock cycle are shown. This power consumption is computed from all signal waveform data required in computation of power consumption, thus the peak value and time can be computed accurately.

As described above, the signal waveform data is extracted as the operation data of the gated clock, but the counter-added netlist, into which a counter for counting the number of operations of the gated clock as described hereinafter is added, may be generated and then subjected to logical simulation to extract a counter value as the operation data. The switching activity is obtained by dividing the counter value by section length. By using this method, it is not necessary to extract the signal waveform data for each clock cycle in the logical simulation.

Figure 6:
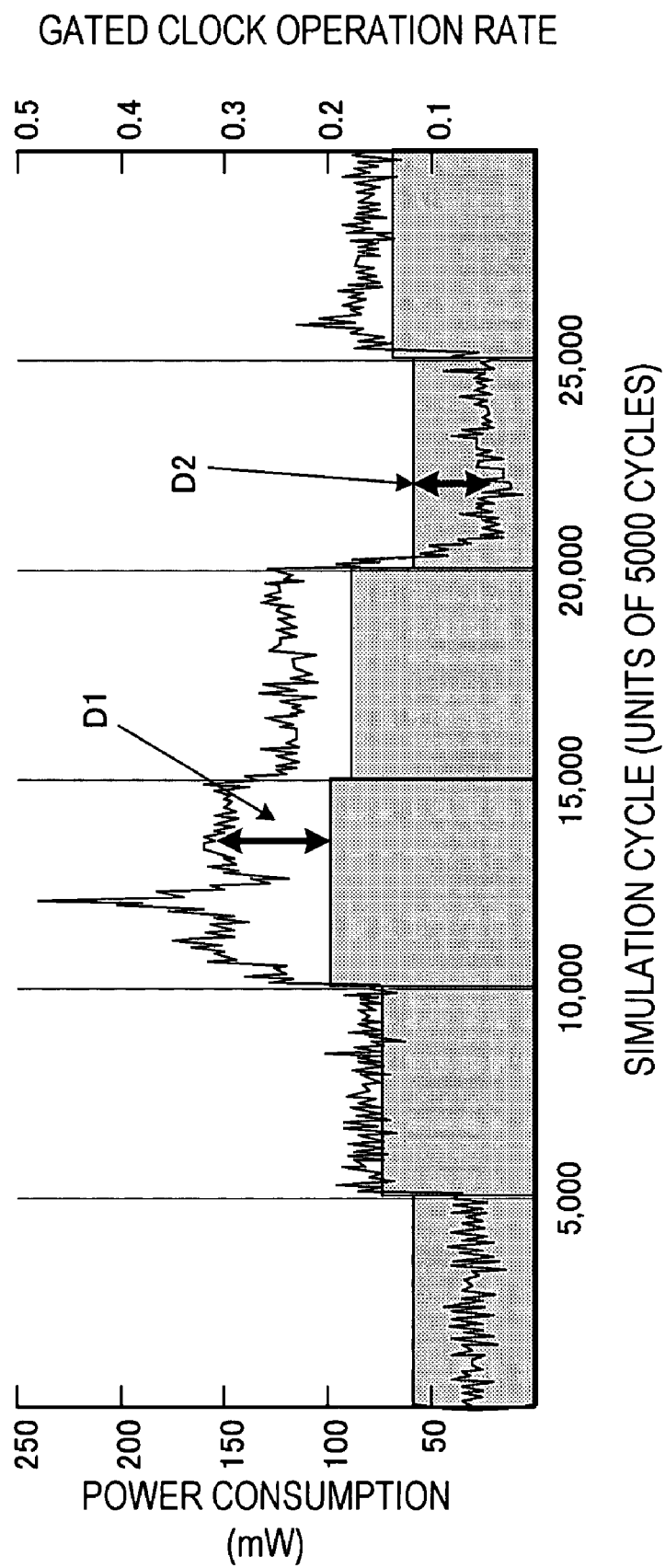
FIG. 6 is a figure showing a modified example of processing for converting signal waveform data into switching activity.
Figure 7:
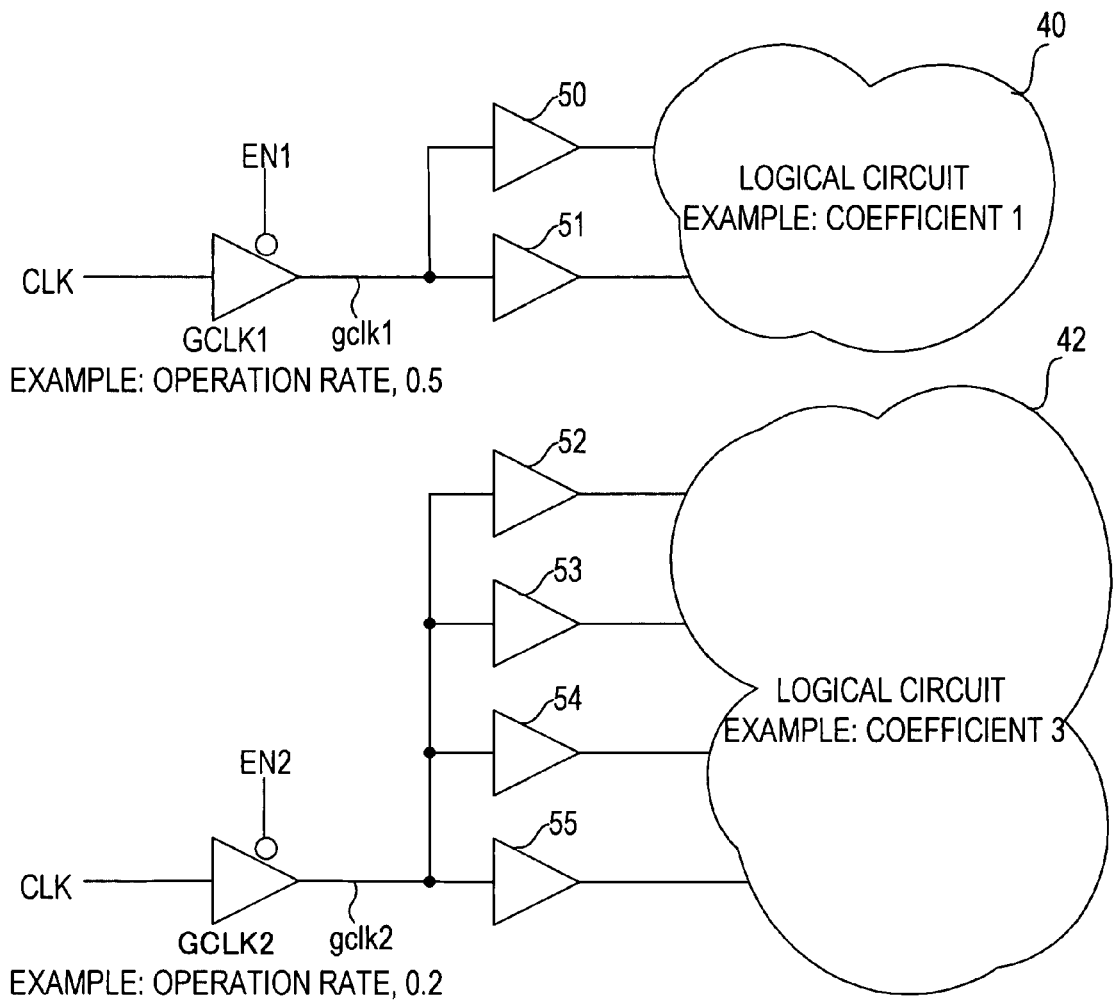
FIG. 7 is a figure showing a modified example of processing for converting signal waveform data into switching activity.

FIG. 6 and FIG. 7 are figures, each showing a modified example of processing for converting the signal waveform data into the switching activity. When converting the signal waveform data into the switching activity per unit time, there is a case in which the differences D1, D2 between the actual power consumption and the switching activity increases, as shown in FIG. 6. The reason is because, as shown in FIG. 7, in a gated clock buffer GCLK1, a clock CLK is supplied as a gated clock gclk1 to a logical circuit group 40 on a subsequent stage on the basis of a enable signal EN1, while in a gated clock buffer GCLK2, the clock CLK is supplied as a gated clock gclk2 to a logical circuit group 42 on a subsequent stage on the basis of an enable signal EN2. Supply of clocks is performed via a plurality of clock buffers 50, 51, and 52 through 55 in accordance with the size of circuits to which the clocks are supplied.

Generally, the power consumption in the small logical circuit group 40 is smaller than the power consumption in the large logical circuit group 42. Also, depending on the internal configurations of the circuits, there is a case where consumption current in one-time operation synchronized with the clock of the logical circuit 40 is smaller than consumption current of the logical circuit 42. For example, in a circuit block containing a number of memories such as a SRAM, since the power consumption of the memory is large, the power consumption is also large even if the size of the circuit itself is small. In the case where the consumption currents in one-time operation on the clocks of the logical circuit 40 and logical circuit 42 are different from each other, even if the switching activities of the gated clocks of the gated clock buffers with respect to the logical circuits 40, 42 are the same, the consumption current is different between the two logical circuits 40, 42.

In these modified examples, weighting coefficients are set in accordance with the logical circuits on the subsequent stages to which the gated clocks are supplied. The coefficient of the circuit with high consumption current is made large, while the coefficient of the circuit with low consumption current is made small. In the example shown in FIG. 7, the coefficient of the logical circuit 40 is 1, and the coefficient of the logical circuit 42 is 3.

Then, when converting the signal waveform data into the switching activity per unit time in the process S14, the abovementioned weighting coefficients are subjected to multiplication and converted to weighted switching activities. In this manner, it can be expected that the errors D1, D2 between the switching activity and the actual power consumption shown in FIG. 6 be further reduced.

Specific Example

Figure 8:
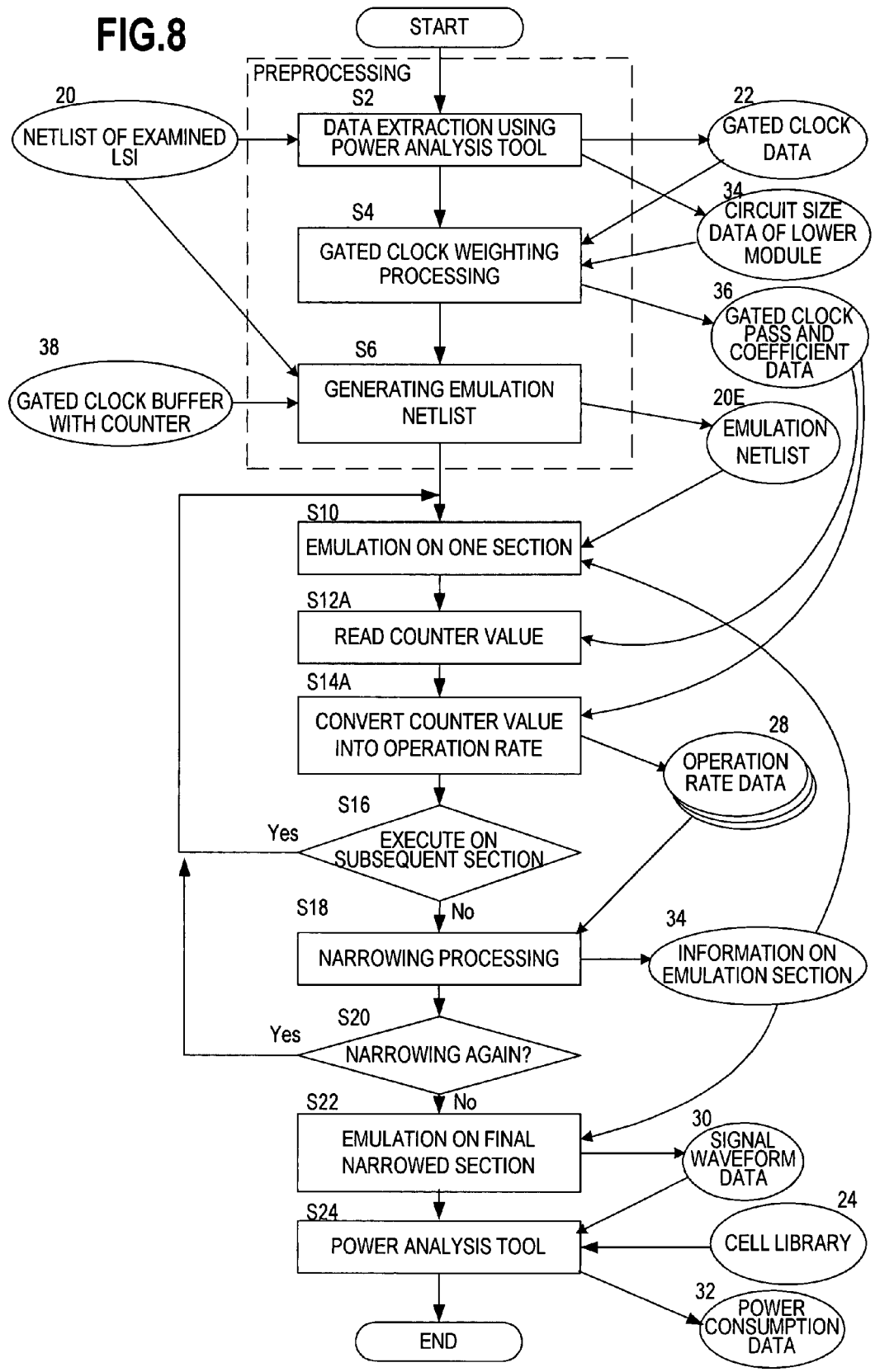
FIG. 8 is a flowchart of a specific power consumption peak estimation program according to the embodiment.

FIG. 8 is a flowchart of a specific power consumption peak estimation program according to the embodiment. In FIG. 8, an emulator, which is a hardware emulator, is used as a logical simulator. Therefore, the logical simulation in FIG. 2 is replaced with emulation performed by the emulator in FIG. 8. "Emulation" here is same as the logical simulation performed by the hardware emulator. This is explained with reference to the following specific examples shown in FIG. 9 and so.

Figure 9:
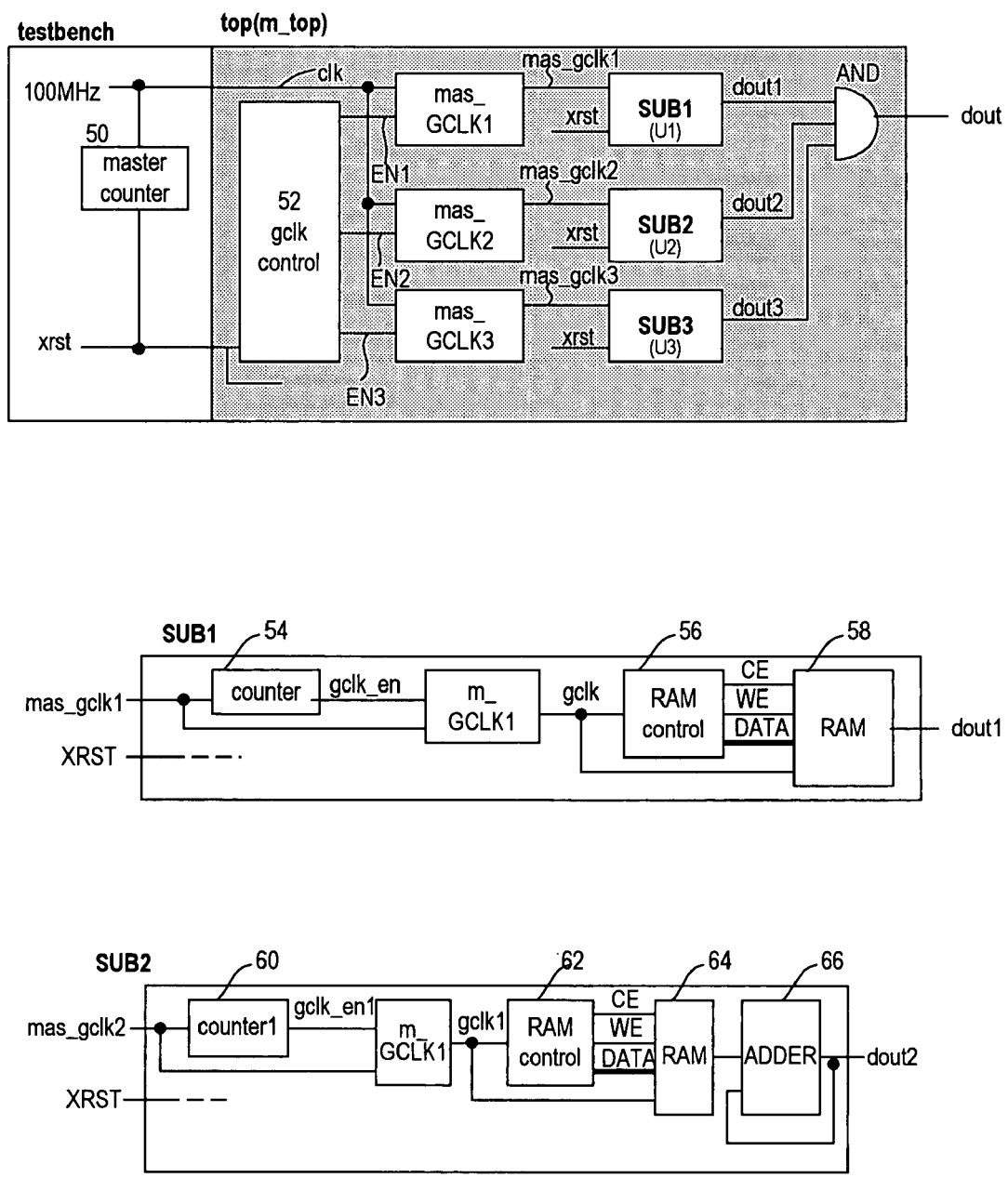
FIG. 9 is a circuit diagram corresponding to a netlist of an examined LSI.

FIG. 9 shows top corresponding to the examined LSI, and a test bench "testbench" for supplying a reset xrst and clock to the top. The testbench has a master counter 50 that counts the number of simulation cycles by an operation clock of 100 MHz of the examined LSI "top". m_top indicates an instance of the examined LSI module. There are three master gated clock buffers mas_GCLK 1 through 3 which generates master gated clocks mas_gclk 1 through 3 from a clock clk on the basis of the enable signals EN1 through EN3, sub-circuits SUB 1, 2, 3 at the bottom layer, to which the master gated clocks are supplied, and an AND gate AND which outputs a logical product of the outputs dout 1, 2, 3 of the sub-circuits.

Further, the sub-circuit SUB 1 has a counter 54 which counts the master gated clock mas_gclk 1 a predetermined number of times and outputs an enable signal gclk_en, a gated clock buffer m_GCLK 1 which generates a gated clock gclk from the master gated clock mas_gclk 1 on the basis of the enable signal gclk_en, a memory controller 56 to which the gated clock gclk is supplied, and a memory 58.

Similarly, the sub-circuit SUB 2 has a counter 60 which counts the master gated clock mas_gclk 2 a predetermined number of times and outputs the enable signal gclk_en 1, the gated clock buffer m_GCLK 1 which generates a gated clock gclk 1 from the master gated clock mas_gclk 2 on the basis of the enable signal gclk_en 1, a memory controller 62 to which the gated clock gclk 1 is supplied, a memory 64, and an adder 66. Although not shown, the sub-circuit SUB 3 also has a similar gated clock buffer.

As described above, a plurality of gated clocks are in the examined LSI, and these gated clocks are supplied to the logical circuits on the subsequent stages. The netlist 20 of such examined LSI is the target of power consumption peak estimation.

Returning to FIG. 8, in the preprocessing, the gated clock data 22 and circuit size data 34 of a lower module to which a gated clock is supplied are extracted from the netlist 20 by means of the data extraction function of the power analysis tool 200 (S2). This gated clock data file 22 has information on the position between the top layer m_top and a level where the gated clock exists.

Figures 10, 11:
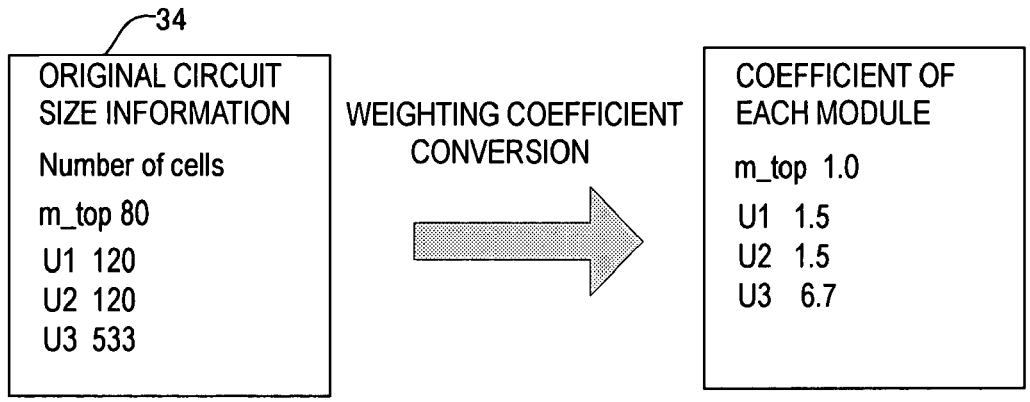
FIG. 10 is a figure showing an example of gated clock data.
FIG. 11 is a figure showing an example of pass data 36 (2) of a gated clock.

FIG. 10 is a figure showing the circuit size data 34 of the lower module and coefficient data 36 of a gated clock. By analyzing the netlist 20, the circuit size data 34 of the lower module to which the gated clock is supplied is extracted (S2). In the example shown in FIG. 10, in the circuit size data 34, the number of cells 80 is associated with the top layer m_top, and the number of cells 120, 120, 533 are associated with modules U1, U2, U3 respectively. It should be noted that the U1, U2, U3 are the names of instances of the sub-circuit modules SUB 1, 2, 3 respectively.

Next, gated clock weighting processing is performed based on the gated clock data 22 and circuit size data 34 (S4). By means of this weighting processing, the coefficient data and a pass file 36 of the circuit modules to which a gated clock is supplied are generated. In FIG. 10, the weighting coefficient data 36 (1) for each module is shown.

Also, FIG. 11 is a figure showing an example of pass data 36 (2) of a gated clock. In FIG. 11, the abovementioned six gated clocks with pass information of the upper stage and subsequent stages are described, and the number of operations of each gated clock is set to 0 (see PASS in the figure). For example, in the first line, the output of the instance m_GCLK 1 of the gated clock within the sub-circuit instance U1 is GOUT.

Next, emulation netlist generation processing is performed (S6). In that case, the gated clock buffers in the netlist 20 of the examined LSI are simultaneously replaced with a gated clock buffer with counter 38.

FIG. 12 is a figure showing the gated clock buffer with counter, which is included in the emulation netlist. In FIG. 12, HDL description for the gated clock buffer with a counter 38 and a circuit diagram thereof 38 (netlist) are shown. This gated clock buffer with counter 38 has a latch 70 for latching the enable signal EN with a clock CK, an AND gate 72 for outputting the logical product of an output M of the latch and the clock CK as a gated clock output GOUT, and a counter 74 for counting the number of changes of the gated clock output GOUT. In the HDL description 38, descriptions 70, 72, 74 of these circuits are included. FIG. 12 also shows an example of HDL description of the counter 74 (module name is "gated_count"), which is added to the gated clock buffer. The counter 74 counts the number of changes of the gated clock GOUT, and outputs a result of the count to a counter value terminal count_va 1 and an overflow terminal overflow.

In this manner, the gated clock buffers in the original netlist 20, each of which is constituted by the latch 70 and AND gate 72, are replaced with the gated clock buffer with counter 38 which is added with the counter 74 for counting the number of changes of the gated clock of the output, whereby an emulation netlist 20E is generated. Specifically, the emulation netlist 20E is a netlist in which the counter 74 is added to the original netlist 20.

Furthermore, in the preprocessing, a read command file for reading a counter value is generated from the gated clock pass 36 (2) shown in FIG. 11. FIG. 13 is a figure showing an example of the read command file. In this read command file 37, there are described a command, "signal get", to acquire a counter value of an output clock clk of the master counter 50 shown in FIG. 9, and the counter values of the abovementioned six gated clocks, and pass data of a gated clock which is a target of acquisition.

Returning to FIG. 8, once the abovementioned preprocessing is ended, the processing similar to the one shown in FIG. 2 is performed on the emulation netlist. First, as the primary processing, logical simulation (emulation) is executed for one section by the emulator (S10). In this example, the emulation is executed with respect to the emulation netlist 20E, and the number of changes of the gated clock generated from this emulation is counted by the added gated clock counter 74.

At the point of time when the logical emulation for one section is ended, the counter value of the gated clock counter 74 is read (S12A). Specifically, the emulator control tool executes the read command file 37 shown in FIG. 13 to read the counter value within the emulator. In other words, in this example, the counter value, which is the number of changes of the clock, is extracted as the operation data of the gated clock.

Then, the power consumption peak estimation tool 300 generates the operation data 28 from the counter value and the coefficient data of the gated clock (36 (1) shown in FIG. 10) (S14A). The abovementioned processes S10 through S14A are repeated for a plurality of sections within the simulation time period (S16).

Figure 14:
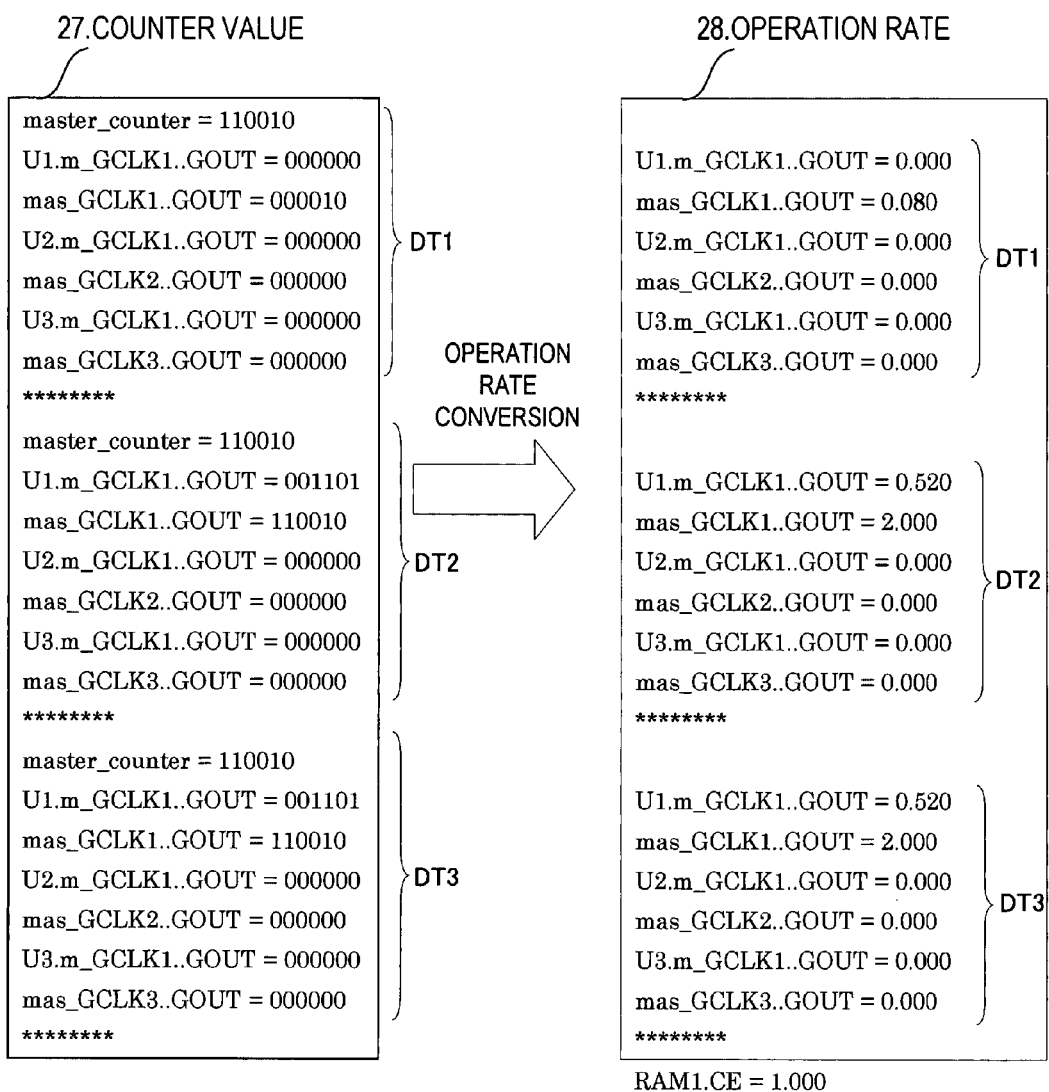
FIG. 14 is a figure showing a specific example of a counter value 27 and a switching activity 28.

FIG. 14 is a figure showing a specific example of a counter value 27 and switching activity 28. The counter value 27 shows counter values that are read in three sections, DT1, DT2 and DT3. Since these sections consist of the same number of cycles, the value of the master counter master_counter is same in all sections as "110010". The switching activity is obtained by dividing these counter value by the master counter value within each section. Here, the switching activity 28 weighted by the coefficient data is generated.

If the average value or total value of the switching activity data for each section is plotted, the switching activity data which is similar to that shown in FIG. 3 is obtained. Therefore, a section having high switching activity is selected by means of the narrowing processing S18 to generate new emulation section information 34. Then, the abovementioned primary processing is repeated until the section is narrowed sufficiently (S20).

When the final narrowed section is established, the secondary processing S22 is performed next. The power consumption peak estimation tool 300 executes logical simulation by means of the emulator with respect to the emulation netlist 20E or the original netlist 20E, and extracts all signal waveform data items 30 required in computation of power consumption. The time period for this simulation is the final narrowed section, and is a relatively short time period in which a power consumption peak occurs, thus this simulation can be completed within a short time even though all signal waveform data items 30 are extracted.

Finally, the extracted signal waveform data items 30 are inputted to the power analysis tool 200 to generate the power consumption data 32 for each clock cycle (S24). Computation of this power consumption data is same as that shown in FIG. 2. As a result, similar power consumption data as that shown in FIG. 5 can be generated.

As described above, in the power consumption peak estimation tool shown in FIG. 8, there is prepared the emulation netlist 20E in which the counter for counting the number of changes of a gated clock is added to the gated clock within the netlist 20 of the examined LSI, and this emulation netlist 20E is subjected to emulation by means of the emulator, whereby the number of operations of the gated clock is extracted using the counter. Then, switching activity, which is weighted by the coefficients allocated to the gated clocks, is obtained to narrow the section in which a power consumption peak occurs. Therefore, it is not necessary to extract the signal waveform data of the gated clocks in the logical simulation by means of the primary processing, thus high-speed processing can be performed.

In aforementioned embodiments, a gated clock, which is effective in an enabling state only, is used in order to reduce power consumption of an LSI. By supplying a gated clock, which is effective at the time of enable, to a circuit, supply of clocks to a circuit which is not required to be operated can be stopped, and thereby power consumption can be restrained. In the LSI that creates a gated clock by means of a gated clock buffer, a close relationship is established between power consumption and the switching activity of the gated clock. In other words, if the switching activity of the gated clock is high, power consumption increases, and if the switching activity of the gated clock is low, power consumption decreases.

Therefore, as a program tool of the embodiment for estimating the peak of power consumption, primary processing is performed in which logic simulation is executed in a first time period to extract operation data of a gated clock for every predetermined section within the first time period, e.g. operation waveform data or data on the number of operations. Then, a narrowed section, which is composed of one or more sections and in which the switching activity per unit time is higher compared to other sections, is discovered, the switching activity being obtained from the operation data, and this narrowed section is taken as a second time period. Then, secondary processing is performed in which logic simulation is executed in the second time period to extract signal waveform data for every clock cycle and obtain power consumption data corresponding to the clock cycles from the extracted signal waveform data.

According to the abovementioned one embodiment, in the primary processing, logical simulation is executed for a long period of time, but the data to be extracted is the operation data of the gated clock only. Therefore, compared to the conventional case in which all signal waveform data items are acquired, the logic simulation can be finished within a short time. In the secondary processing, on the other hand, the logic simulation is executed to acquire all signal waveform data items. However, the logic simulation is performed only in a narrowed short period of time, thus compared to the conventional case in which signal waveform data is acquired in a long period of time, the logic simulation can be finished within a short time. Therefore, the peak of power consumption can be estimated within generally a short time.

In order to achieve the abovementioned object, another aspect of the embodiment is a power consumption peak estimation program for estimating a power consumption peak for a netlist of an LSI having a gated clock, the program causing a computer to construct primary processing means for executing logical simulation on the netlist throughout a first time period to extract operation data of the gated clock for every predetermined section within the first time period, secondary processing means for executing logical simulation on the netlist throughout a narrowed section to extract signal waveform data for every clock cycle in the narrowed section, the narrowed section being composed of one or a plurality of sections in which the switching activity of the gated clock, which is obtained from the operation data extracted by the primary processing means, is higher than the switching activity in other sections, and power consumption generating means for generating power consumption data corresponding to the clock cycles, from the signal waveform data extracted by the secondary processing means.

According to the abovementioned another aspect, time at which the power consumption of the LSI reaches the peak, and a peak value can be estimated within a short time with a small number of man-hours.

In the abovementioned another aspect, according to a preferred embodiment, the primary processing means repeats the primary processing a plurality of times, and in the second and subsequent primary processings, the logic simulation is executed on the netlist throughout a narrowed section which is composed of one or more narrowed sections and in which the switching activity of the gated clock is higher compared to other sections, the switching activity of the gated clock being obtained from the operation data extracted in the previous primary processing, and the operation data is extracted for every short section which is shorter than the predetermined sections in the previous primary processing. According to this aspect, the primary processing means narrows a section in which the switching activity of the gated clock is high, while repeating the primary processing a plurality of times, thus the section of the logic simulation to be executed by the secondary processing means can be narrowed, and the number of man-hours can be reduced.

In the abovementioned another aspect, according to a preferred aspect, the primary processing means performs logic simulation on the netlist of the LSI to extract the signal waveform data of the gated clock as the operation data. In this case, the switching activity for every predetermined section is obtained from the signal waveform data.

In the abovementioned another aspect, according to a preferred aspect, the switching activity of the gated clock is subjected to weighting processing based on a weighting coefficient assigned to a circuit to which the gated clock is supplied, and the narrowed section is determined based on the switching activity which is subjected to the weighting processing. By performing the weight processing based on the weighting coefficient corresponding to the size of the circuit, a section having high power consumption can be narrowed more accurately.

In the abovementioned another aspect, according to a preferred aspect, the primary processing means creates a counter-added netlist by adding, to the netlist of the LSI, a counter for counting the number of pulses of the gated clock, and executes logic simulation on the counter-added netlist to extract a counter value of the counter as the operation data. In this case, the switching activity for every predetermined section is obtained from the counter value.

In the abovementioned another aspect, the primary processing means extracts the counter value of the counter for the each predetermined section. Therefore, it is not necessary to extract data of H, L for every clock cycle as the signal waveform data, thus logic simulation can be executed in a shorter time.

In order to achieve the abovementioned object, another aspect of the embodiment is a power consumption peak estimation program for estimating a power consumption peak for a netlist of an LSI having a gated clock, the power consumption peak estimation program having, primary processing means for executing logical simulation on the netlist throughout a first time period to extract operation data of the gated clock for every predetermined section within the first time period, secondary processing means for executing logical simulation on the netlist throughout a narrowed section to extract signal waveform data for every clock cycle in the narrowed section, the narrowed section being composed of one or a plurality of sections in which the switching activity of the gated clock, which is obtained from the operation data extracted by the primary processing means, is higher than the switching activity in other sections, and power consumption generating means for generating power consumption data corresponding to the clock cycles, from the signal waveform data extracted by the secondary processing means.

According to another aspect, time at which the power consumption of the LSI reaches the peak, and a peak value can be estimated within a short time with a small number of man-hours.

According to the embodiment, the peak of power consumption of the LSI can be estimated with a small number of man-hours. The technical scope of the present invention is not limited to aforementioned embodiment.

What is claimed is:

1. A computer-implemented method for estimating a power consumption peak, the method comprising:
 executing, using a primary processing unit, logical simulation on a netlist throughout a first time period to extract operation data of a gated clock for every predetermined section within the first time period;
 executing, using a secondary processing unit, logical simulation on the netlist throughout a narrowed section to extract signal waveform data for every clock cycles in the narrowed section, the narrowed section being composed of one or a plurality of sections in which the switching activity of the gated clock, which is obtained from the operation data extracted by the primary processing unit, is higher than the switching activity in other sections; and
 generating power consumption data corresponding to the clock cycles, from the signal waveform data extracted by the secondary processing unit,
 wherein the switching activity of the gated clock is subjected to weighting processing on the basis of a weighting coefficient allocated to a circuit to which the gated clock is supplied,
 wherein a first weighting coefficient, which is larger than a second weighting coefficient, is allocated to a first circuit when a power consumption for one operation of the first circuit in synchronization with a clock supplied to the first circuit is larger than a power consumption for one operation of the second circuit in synchronization with a clock supplied to the second circuit, the second weighting coefficient being allocated to the second circuit.

2. The according to claim 1, wherein the primary processing unit repeats the primary processing a plurality of times, and in primary processing subsequent to a first primary processing, the logical simulation is executed on the netlist throughout a narrowed section to extract the operation data for every section which is shorter than the predetermined section in a previous primary processing, the narrowed section being composed of one or a plurality of sections in which the switching activity of the gated clock, which is obtained from the operation data extracted by the previous primary processing, is higher than the switching activity in other sections.

3. The according to claim 1, wherein the primary processing unit performs logical simulation on the netlist of the LSI to extract the signal waveform data of the gated clock as the operation data.

4. The according to claim 1, wherein the primary processing unit adds a counter counting the number of pulses of the gated clock to the netlist of the LSI so as to generate a counter-added netlist, executes the logical simulation on the counter-added netlist, and extracts a counter value of the counter as the operation data.

5. The according to claim 4, wherein the primary processing unit extracts the counter value of the counter for the each predetermined section.

6. The according to claim 1, wherein the narrowed section is determined based on the switching activity which is subjected to the weighting processing.

7. A computer-implemented method for estimating a power consumption, the method comprising:
generating from a netlist, a counter-added netlist in which a counter counting the number of changes of a gated clock is added to a gated clock buffer within the netlist;
executing, using a primary processing unit, logical simulation on the counter-added netlist throughout a first time period, and extracts a counter value of the gated clock for every predetermined section within the first time period;
determining a narrowed section which is composed of one or a plurality of sections in which switching activity of the gated clock, which is obtained from the counter value extracted by the primary processing unit, is higher than the switching activity in other sections;
executing, using a secondary processing unit, logical simulation on the netlist throughout the narrowed section to extract signal waveform data for every clock cycles in the narrowed section; and
generating power consumption data corresponding to the clock cycles, from the signal waveform data extracted by the secondary processing unit,
wherein the switching activity of the gated clock is subjected to weighting processing based on a weighting coefficient allocated to a circuit to which the gated clock is supplied,
wherein a first weighting coefficient, which is larger than a second weighting coefficient, is allocated to a first circuit when a power consumption for one operation of the first circuit in synchronization with a clock supplied to the first circuit is larger than a power consumption for one operation of the second circuit in synchronization with a clock supplied to the second circuit, the second weighting coefficient being allocated to the second circuit.

8. The according to claim 7, wherein the primary processing unit repeats the primary processing a plurality of times, and in primary processing subsequent to a first primary processing, the logical simulation is executed on the counter-added netlist throughout a narrowed section to extract the operation data for every section which is shorter than the predetermined section in a previous primary processing, the narrowed section being composed of one or a plurality of sections in which the switching activity of the gated clock, which is obtained from the counter value extracted by the previous primary processing, is higher than the switching activity in other sections.

9. The according to claim 7, wherein the narrowed section is determined based on the switching activity which is subjected to the weighting processing.

10. A power consumption peak estimation device estimating a power consumption peak, the power consumption peak estimation device comprising:
a primary processing unit, which executes logical simulation on a netlist throughout a first time period to extract operation data of a gated clock for every predetermined section within the first time period;
a secondary processing unit, which executes logical simulation on the netlist throughout a narrowed section to extract signal waveform data for every clock cycles in the narrowed section, the narrowed section being composed of one or a plurality of sections in which the switching activity of the gated clock, which is obtained from the operation data extracted by the primary processing unit, is higher than the switching activity in other sections; and
a power consumption generating unit, which generates power consumption data corresponding to the clock cycles, from the signal waveform data extracted by the secondary processing unit; and
a gated clock weighting unit which performs weighting processing on the gated clock based on a weighting coefficient allocated to a circuit to which the gated clock is supplied,
wherein a first weighting coefficient, which is larger than a second weighting coefficient, is allocated to a first circuit when a power consumption for one operation of the first circuit in synchronization with a clock supplied to the first circuit is larger than a power consumption for one operation of the second circuit in synchronization with a clock supplied to the second circuit, the second weighting coefficient being allocated to the second circuit.

11. The power consumption peak estimation device according to claim 10, wherein the primary processing unit repeats the primary processing a plurality of times, and in primary processing subsequent to a first primary processing, the logical simulation is executed on the netlist throughout a narrowed section to extract the operation data for every section which is shorter than the predetermined section in a previous primary processing, the narrowed section being composed of one or a plurality of sections in which the switching activity of the gated clock, which is obtained from the operation data extracted by the previous primary processing, is higher than the switching activity in other sections.

12. A power consumption peak estimation device estimating a power consumption, the power consumption peak estimation device comprising:

a counter-added netlist generating unit, which generates, from a netlist, a counter-added netlist in which a counter counting the number of changes of a gated clock is added to a gated clock buffer within the netlist;

a primary processing unit, which executes logical simulation on the counter-added netlist throughout a first time period, and extracts a counter value of the gated clock for every predetermined section within the first time period;

a narrowed section determining unit, which determines a narrowed section which is composed of one or a plurality of sections in which switching activity of the gated clock, which is obtained from the counter value extracted by the primary processing unit, is higher than the switching activity in other sections;

a secondary processing unit, which executes logical simulation on the netlist throughout the narrowed section to extract signal waveform data for every clock cycles in the narrowed section;

a power consumption generating unit, which generates power consumption data corresponding to the clock cycles, from the signal waveform data extracted by the secondary processing unit; and a gated clock weighting unit which performs weighting processing on the gated clock based on a weighting coefficient allocated to a circuit to which the gated clock is supplied, wherein a first weighting coefficient, which is larger than a second weighting coefficient, is allocated to a first circuit when a power consumption for one operation of the first circuit in synchronization with a clock supplied to the first circuit is larger than a power consumption for one operation of the second circuit in synchronization with a clock supplied to the second circuit, the second weighting coefficient being allocated to the second circuit.

13. The power consumption peak estimation device according to claim 12, wherein the primary processing unit repeats the primary processing a plurality of times, and in primary processing subsequent to a first primary processing, the logical simulation is executed on the counter-added netlist throughout a narrowed section to extract the operation data for every section which is shorter than the predetermined section in a previous primary processing, the narrowed section being composed of one or a plurality of sections in which the switching activity of the gated clock, which is obtained from the counter value extracted by the previous primary processing, is higher than the switching activity in other sections.

14. The method according to claim 1, wherein the first weighting coefficient and the second weighting coefficient are obtained from information where weighting coefficient data is associated with each of a plurality of circuits respectively.

15. The method according to claim 7, wherein the first weighting coefficient and the second weighting coefficient are obtained from information where weighting coefficient data is associated with each of a plurality of circuits respectively.

16. The power consumption peak estimation device according to claim 10, wherein the first weighting coefficient and the second weighting coefficient are obtained from information where weighting coefficient data is associated with each of a plurality of circuits respectively.

17. The power consumption peak estimation device according to claim 12, wherein the first weighting coefficient and the second weighting coefficient are obtained from information where weighting coefficient data is associated with each of a plurality of circuits respectively.

18. The method according to claim 1, wherein the first weighting coefficient is allocated to the first circuit after the power consumptions of the first circuit and the second circuit are determined based on circuit size.

19. The method according to claim 7, wherein the first weighting coefficient is allocated to the first circuit after the power consumptions of the first circuit and the second circuit are determined based on circuit size.

20. The power consumption peak estimation device according to claim 10, wherein the first weighting coefficient is allocated to the first circuit after the power consumptions of the first circuit and the second circuit are determined based on circuit size.

21. The power consumption peak estimation device according to claim 12, wherein the first weighting coefficient is allocated to the first circuit after the power consumptions of the first circuit and the second circuit are determined based on circuit size.

* * * * *